US012745467B2

(12) United States Patent
Yu et al.

(10) Patent No.: US 12,745,467 B2
(45) Date of Patent: Sep. 22, 2026

(54) INPUT/OUTPUT PORT CIRCUIT AND CHIP THEREOF

(71) Applicant: REALTEK SEMICONDUCTOR CORP., Hsinchu (TW)

(72) Inventors: Sz-Ying Yu, Hsinchu (TW); Chen-Hsuan Ku, Hsinchu (TW); Shang-Hung Lin, Hsinchu (TW); Kun-Yu Tai, Hsinchu (TW)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 798 days.

(21) Appl. No.: 17/941,377

(22) Filed: Sep. 9, 2022

(65) Prior Publication Data

US 2024/0014205 A1 Jan. 11, 2024

(30) Foreign Application Priority Data

Jul. 5, 2022 (TW) ................................. 111125225

(51) Int. Cl.
*H01L 27/02* (2006.01)
*H10D 89/60* (2025.01)

(52) U.S. Cl.
CPC ................................ *H10D 89/921* (2025.01)

(58) Field of Classification Search
CPC .... H10D 89/611; H10D 89/60; H10D 89/921; H10D 62/124; H10D 62/115; H10D 84/221; H10D 64/23; H10D 8/045; H10D 8/00; H10D 62/60; H01L 21/3065; H01L 21/0273; H01L 21/743; H01L 21/223
See application file for complete search history.

(56) References Cited

U.S. PATENT DOCUMENTS

| | | | | |
|---|---|---|---|---|
| 5,449,940 A * | 9/1995 | Hirata | H10D 89/811 | 257/361 |
| 7,869,175 B2 * | 1/2011 | Song | H01L 23/62 | 361/56 |
| 2002/0033507 A1 * | 3/2002 | Maria Verhaege | H10D 89/811 | 257/355 |
| 2006/0041397 A1 * | 2/2006 | Kemper | G06F 30/398 | 702/117 |
| 2006/0198070 A1 * | 9/2006 | Marr | H03K 5/08 | 361/56 |
| 2007/0228410 A1 * | 10/2007 | Smeloy | H10D 89/713 | 257/107 |
| 2008/0211791 A1 * | 9/2008 | Ryu | H04L 25/0272 | 345/204 |

(Continued)

*Primary Examiner* — Jarrett J Stark
(74) *Attorney, Agent, or Firm* — Birch, Stewart, Kolasch & Birch, LLP

(57) ABSTRACT

An input/output port circuit includes an input/output pad, a transistor, and a conductive routing wire. The transistor has a first connection terminal and a second connection terminal. The first connection terminal of the transistor is electrically connected to the input/output pad through a conductive connection wire, and the second connection terminal is electrically connected to another transistor. The conductive routing wire is electrically connected to the first terminal of the transistor. The conductive routing wire is configured to provide a serial resistance, thereby forcing a surge current to flow toward the another transistor when the surge current is inputted in the input/output circuit through the input/output pad.

20 Claims, 5 Drawing Sheets

(56) References Cited

U.S. PATENT DOCUMENTS

| | | | | |
|---|---|---|---|---|
| 2011/0205679 | A1* | 8/2011 | Fuchigami | H02H 9/046<br>361/88 |
| 2015/0235584 | A1* | 8/2015 | Eom | G09G 3/3233<br>345/213 |
| 2018/0226792 | A1* | 8/2018 | Segervall | H02H 9/046 |
| 2019/0013674 | A1* | 1/2019 | Whitehouse | H02J 3/36 |
| 2019/0123037 | A1* | 4/2019 | Holland | H10D 89/611 |
| 2019/0286419 | A1* | 9/2019 | Lin | G11C 13/0004 |
| 2020/0014375 | A1* | 1/2020 | Arimura | H03K 19/20 |
| 2020/0036182 | A1* | 1/2020 | Hanson | H02H 3/20 |
| 2020/0070095 | A1* | 3/2020 | Barber | B01D 63/085 |
| 2020/0127664 | A1* | 4/2020 | Whitney | H10D 1/47 |
| 2020/0225721 | A1* | 7/2020 | Yu | G06F 1/30 |
| 2021/0104186 | A1* | 4/2021 | Fujikawa | G09G 3/3611 |
| 2021/0408120 | A1* | 12/2021 | Lin | H10D 30/6757 |
| 2024/0014205 | A1* | 1/2024 | Yu | H10D 89/921 |
| 2025/0169219 | A1* | 5/2025 | Kim | H10F 39/813 |

* cited by examiner

INPUT/OUTPUT PORT CIRCUIT AND CHIP THEREOF

CROSS-REFERENCE TO RELATED APPLICATION

This non-provisional application claims priority under 35 U.S.C. § 119(a) to Patent Application No. 111125225 filed in Taiwan, R.O.C. on Jul. 5, 2022, the entire contents of which are hereby incorporated by reference.

BACKGROUND

Technical Field

The present application relates to the prevention technology of surge current. In particular, the present application relates to an input/output port circuit and chip thereof that can prevent the internal transistor from being damaged by the surge current.

Related Art

A surge current refers to an overload current that occurs instantaneously in a circuit, which may damage the circuit. In a circuit, the drain terminal of a MOSFET (metal oxide semiconductor field effect transistor) is connected to an input/output pad. However, the impedance of the drain terminal of the MOSFET is lower owing that no additional connection wire is connected to the drain terminal of the MOSFET. Therefore, when a surge current is inputted through an input/output pad, this large current will concentrate on the drain terminal of the MOSFET, thereby causing the MOSFET to be damaged due to being punctured by the surge current.

SUMMARY

The present application provides an input/output port circuit. In an embodiment, the input/output port circuit includes an input/output pad, a transistor, and a conductive routing wire. The transistor has a first connection terminal and a second connection terminal. The first connection terminal of the transistor is electrically connected to the input/output pad through a conductive connection wire, and the second connection terminal is electrically connected to another transistor. The conductive routing wire is electrically connected to the first connection terminal of the transistor. The conductive routing wire is configured to provide a serial resistance, thereby forcing a surge current to flow toward the another transistor when the surge current is inputted in the input/output port circuit through the input/output pad.

In some embodiments, the first connection terminal of the transistor is only electrically connected to the input/output pad and the conductive routing wire.

In some embodiments, the conductive connection wire and at least portion of the conductive routing wire are located in different metal layers in a layout of the input/output port circuit.

In some embodiments, the conductive routing wire comprises a first connection segment, a routing segment, and a second connection segment sequentially connected to each other in the layout of the input/output port circuit. The first connection segment and the second connection segment are electrically connected to the first connection terminal of the transistor, respectively, and the first connection segment does not contact the second connection segment.

In some embodiments, the conductive routing wire and the conductive connection wire are located in the same metal layer in the layout of the input/output port circuit, and the routing segment of the conductive routing wire does not overlap the conductive connection wire.

In some embodiments, the routing segment of the conductive routing wire at least partially overlaps a layout of the transistor.

In some embodiments, the routing segment of the conductive routing wire at least partially overlaps a layout of a control terminal of the transistor.

In some embodiments, the routing segment of the conductive routing wire does not overlap a layout of the second connection terminal of the transistor.

In some embodiments, the first connection segment of the conductive routing wire is opposite and parallel to the second connection segment. The routing segment of the conductive routing wire comprises a first routing portion, a second routing portion, a third routing portion, a fourth routing portion, and a fifth routing portion sequentially connected to each other. The routing segment of the conductive routing wire is connected to the first connection segment through the first routing portion and is connected to the second connection segment through the fifth routing portion. The second routing portion is opposite to the first connection segment. The fourth routing portion is opposite to the second connection segment. The first routing portion and the fifth routing portion are respectively opposite to the third routing portion.

In some embodiments, the third routing portion comprises a first sub-routing, a second sub-routing, a third sub-routing, a fourth sub-routing, and a fifth sub-routing sequentially connected to each other. The third routing portion is connected to the second routing portion through the first sub-routing and is connected to the fourth routing portion through the fifth sub-routing. The first sub-routing is opposite to the first routing portion. The fifth sub-routing is opposite to the fifth routing portion. The second sub-routing is opposite to the fourth sub-routing.

The present application further provides a chip. In an embodiment, the chip comprises the input/output port of any of the embodiments.

Detailed features and advantages of the present application are described in detail in the following implementations, and the content of the implementations is sufficient for a person skilled in the art to understand and implement the technical content of the present application. A person skilled in the art can easily understand the objectives and advantages related to the present application according to the contents disclosed in this specification, the claims and the drawings.

DETAILED DESCRIPTION

To make the objectives, features, and advantages of the embodiments of the present application more comprehensible, the following provides detailed descriptions with reference to the accompanying drawings.

Figure 1:
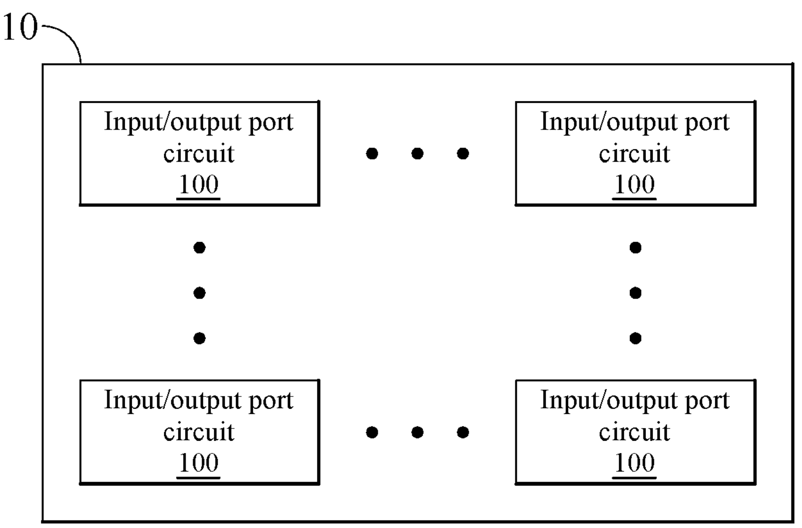
FIG. 1 illustrates a schematic block diagram of a chip according an embodiment of the present application.

FIG. 1 illustrates a schematic block diagram of a chip according to an embodiment of the present application. Please refer to FIG. 1, a chip 10 includes at least one input/output port circuit 100. For the sake of brevity, in this embodiment, the chip 10 comprises one input/output port circuit 100 as an example, but the number of the input/output port circuit 100 is not limited thereto. Furthermore, it is noted that, the chip 10 can further include other circuits and/or elements, depending on the application of the chip 10, which will not be described in detail in the present application.

Figure 2:
FIG. 2 illustrates a schematic diagram of an input/output port circuit according to an embodiment of the present application.
Figure 2:
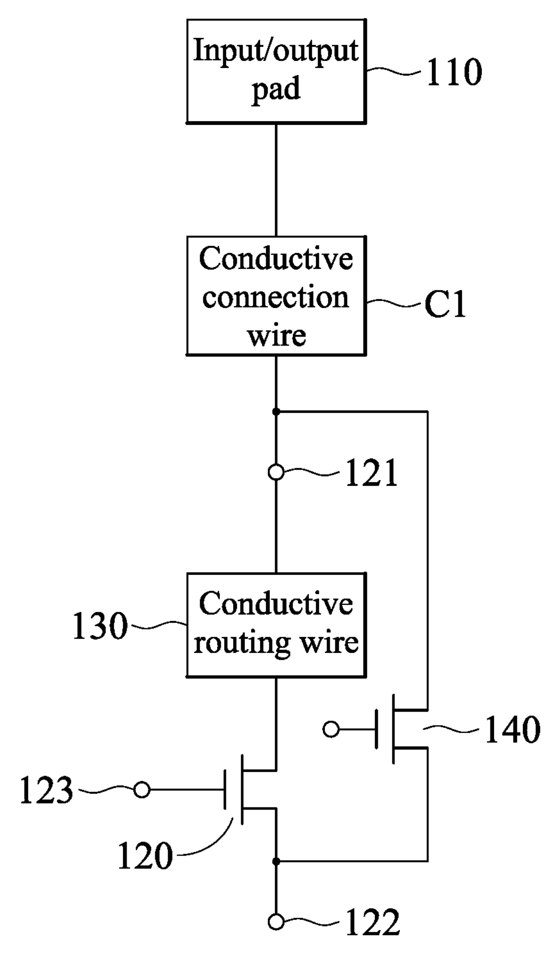

FIG. 2 illustrates a schematic diagram of the input/output port circuit according to an embodiment of the present application. Please refer to FIG. 2. In an embodiment, the input/output port circuit 100 includes an input/output pad 110, a transistor 120, and a conductive routing wire 130. The input/output pad 110 can be used to receive an input signal inputted from the exterior and/or to output an output signal from the interior. In some implementations, the input/output pad 110 is a wire bonding pad and may be electrically connected to a corresponding conductive structure on a packaging substrate (not shown) (such as a pin or a conductive frame on the packaging substrate) through wire bonding. Furthermore, the input/output pad 110 may be an input/output pad applied to a network socket.

The transistor 120 has two connection terminals (hereinafter, referred to as a first connection terminal 121 and a second connection terminal 122, respectively) and a control terminal 123. The first connection terminal 121 of the transistor 120 is electrically connected to the input/output pad 110 through a conductive connection wire C1 to receive the input signal inputted via the input/output pad 110 and/or to output the output signal via the input/output pad 110 from the interior, and the second connection terminal 122 of the transistor 120 is electrically connected to another transistor € thewa-140. Wherein, the number of the another transistor 140 may be at least one. In some embodiments, the control terminal 123 of the transistor 120 may be electrically connected to other circuits, elements, other input/output pads, or the like in the chip 10, and the second connection terminal 122 can be further electrically connected to other circuits, elements, other input/output pads, or the like in the chip 10, but the present application is not limited thereto. Furthermore, the number of the transistor 120 may be at least one. For the sake of brevity, in the present application, the input/output port circuit 100 comprises a single transistor 120 as an example, but the number of the transistor 120 is not limited thereto. In some implementations, the transistor 120 may be a MOSFET (metal oxide semiconductor field effect transistor), the first connection terminal 121 is a drain terminal, the second connection terminal 122 is a source terminal, and the control terminal 123 is a gate terminal, but the present application is not limited thereto. Alternatively, in some embodiments, the transistor 120 may also be a bipolar transistor (BJT) or an insulated gate bipolar transistor (IGBT), or the like. Since the person skilled in the art realize how to replace the connection terminals of the MOSFET, the BJT and the IGBT with each other, detailed descriptions thereof will be omitted.

The conductive routing wire 130 is electrically connected to the first connection terminal 121 of the transistor 120. The conductive routing wire 130 is configured to provide a serial resistance at the first connection terminal 121 of the transistor 120 to increase the resistance of the first connection terminal 121 of the transistor 120. In some implementations, the conductive routing wire 130 is made of conductive material with a positive temperature coefficient. In other words, in these implementations, the serial resistance provided by the conductive routing wire 130 will increase when the temperature rises.

When a surge current is inputted in the input/output port circuit 100 through the input/output pad 110 and flows to the first connection terminal 121 of the transistor 120 through the conductive connection wire C1, the surge current flows through the conductive routing wire 130 via the first connection terminal 121 of the transistor 120. Since the surge current is a large current, the temperature of the conductive routing wire 130 will rise when the surge current passes through the conductive routing wire 130, and the serial resistance provided by the conductive routing wire 130 will also increase accordingly. In this case, the conductive routing wire 130 thus can force the surge current to flow toward the drain terminal of another transistor 140 with a relatively low resistance for the effect of current dispersion, thereby avoiding the transistor 120 from being damaged due to being punctured by the large current concentrating on the first connection terminal 121 of the transistor 120.

In some embodiments, the first connection terminal 121 of the transistor 120 can only be electrically connected to the conductive routing wire 130 and the conductive connection wire C1. Therefore, the resistance at the first connection terminal 121 of the transistor 120 mainly depends on the conductive routing wire 130 and the conductive connection wire C1.

In some embodiments, the chip 10 includes a layout substrate (not shown), and the input/output port circuit 100 may be disposed on the layout substrate through an integrated circuit process. In the layout of the chip 10, since the length of the conductive connection wire C1 is substantially fixed and the resistance that can be provided by the conductive connection wire C1 is also fixed, the resistance at the first connection terminal 121 of the transistor 120 is mainly changed by the serial resistance provided by the conductive routing wire 130. For example, the serial resistance provided by the conductive routing wire 130 can be changed by changing the wire length, wire width, or wire spacing of the conductive routing wire 130, the number of contacts and/or vias connected to the conductive routing wire 130, or any combination of the foregoing. In some implementations, in the layout of the chip 10, the conductive routing wire 130 may be configured in any form (or pattern), such as but not limited to Z-shaped, L-shaped, M-shaped, C-shaped, and so on. In some embodiments, to meet the requirements of current density (EM) and surge (500V), the serial resistance provided by the conductive routing wire 130 has to be at least greater than several tens of ohms.

Figure 3:
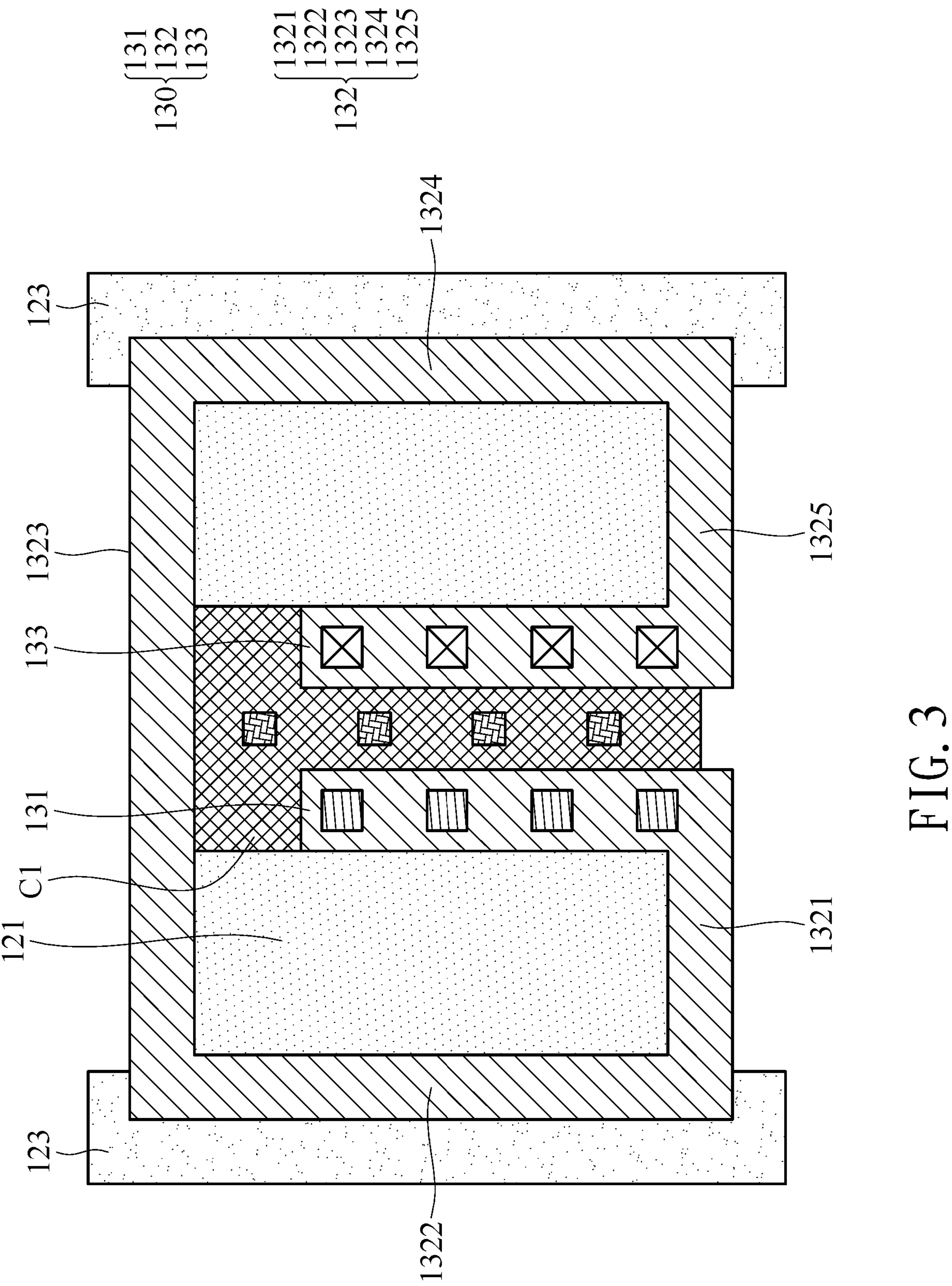
FIG. 3 illustrates a schematic top view of a partial layout of an input/output port circuit according to an embodiment of the present application.
Figure 4:
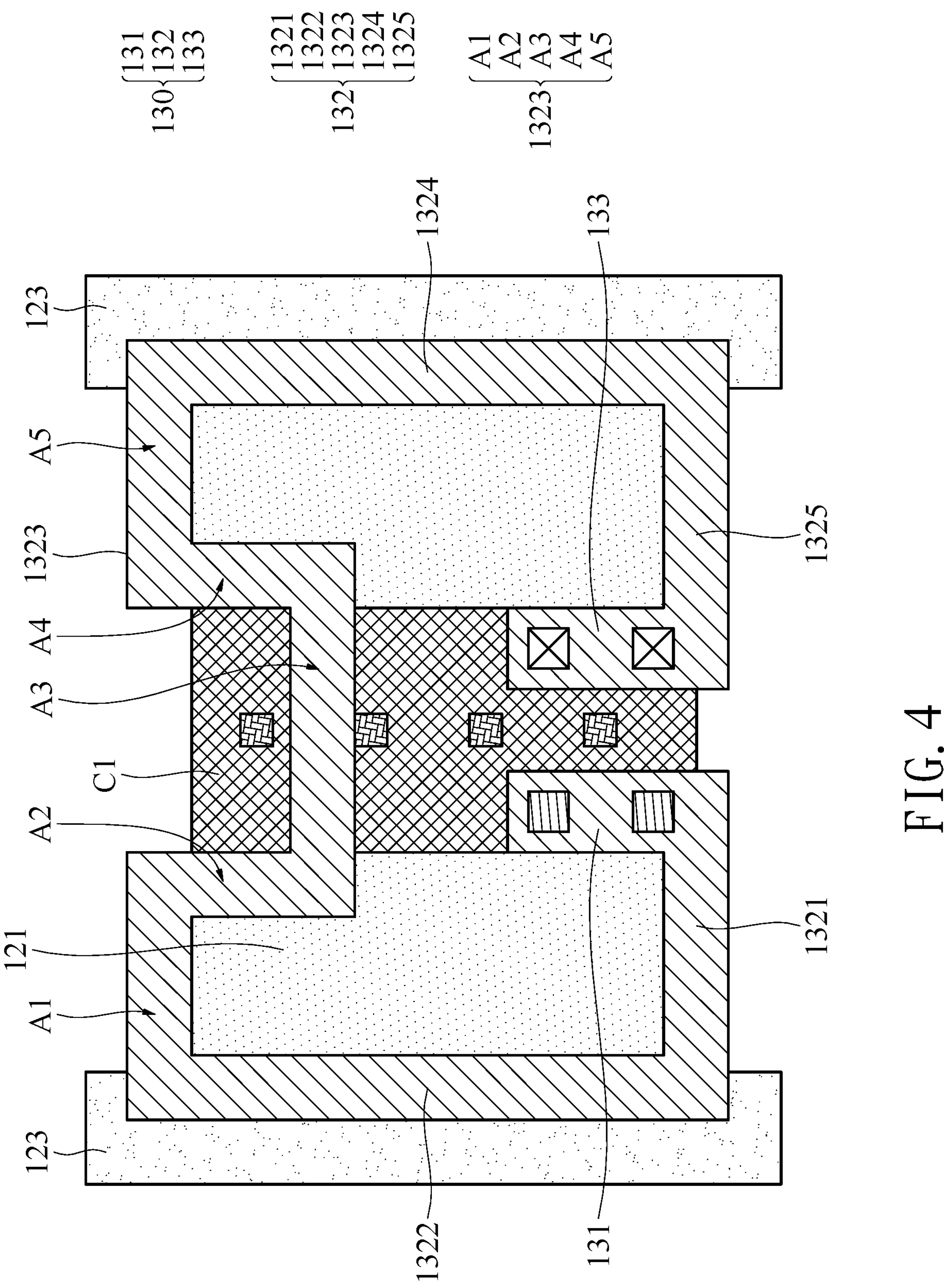
FIG. 4 illustrates a schematic top view of a partial layout of an input/output port circuit according to an embodiment of the present application.

FIG. 3 and FIG. 4 illustrate schematic top views of a partial layout of the input/output port circuit according to an embodiment of the present application, respectively. The layout of the second connection terminal 122 of the transistor 120 is not shown. Please refer to FIG. 3 and FIG. 4. In some embodiments, in the layout of the input/output port circuit 100, the conductive routing wire 130 can include a first connection segment 131, a routing segment 132, and a second connection segment 133 sequentially connected to each other. The first connection segment 131 and the second connection segment 133 of the conductive routing wire 130 may be electrically connected to the first connection terminal 121 of the transistor 120 through the contacts and/or vias, respectively, and the first connection segment 131 does not directly contact the second connection segment 133.

In some embodiments, in a layout of the input/output port circuit 100, the conductive connection wire C1 and the conductive routing wire 130 may be respectively made of a single metal layer, and the conductive connection wire C1 and the conductive routing wire 130 may be located in the same metal layer or different metal layers. In an example, as shown in FIG. 3 and FIG. 4, in the case of the conductive connection wire C1 and the conductive routing wire 130 are located in different metal layers, the conductive connection wire C1, for example, may be located in a metal 1 layer and electrically connected to the first connection terminal 121 of the transistor 120 through contacts, the conductive routing wire 130, for example, may be located in a metal 2 layer, and the first connection segment 131 and the second connection segment 133 of the conductive routing wire 130 can be electrically connected to the conductive connection wire C1 through vias, respectively. Therefore, the conducting routing wire 130 is electrically connected to the first connection terminal 121 of the transistor 120 through the contacts on the conductive connection wire C1. In another example, in the case of the conductive connection wire C1 and the conductive routing wire 130 are located in the same metal layer, the conductive connection wire C1, for example, may be located in a metal 1 layer and electrically connected to the first connection terminal 121 of the transistor 120 through contacts, the conductive routing wire 130 is also located in the Metal 1 layer, and the first connection segment 131 and the second connection segment 133 of the conductive routing wire 130 can overlap or contact the conductive connection wire C1. Therefore, the conducting routing wire 130 is electrically connected to the first connection terminal 121 of the transistor 120 through the contacts on the conductive connection wire C1. Herein, the routing segment 132 of the conductive routing wire 130 does not overlap or contact the conductive connection wire C1.

In some embodiments, in a layout of the input/output port circuit 100, the conductive connection wire C1 and the conductive routing wire 130 may also be any combination of multiple metal layers. For instance, the conductive connection wire C1 is a combination of metal 1 layer and metal 2 layer, and the conductive routing wire 130 is a single metal 3 layer or a combination of metal 2 layer and metal 3 layer. Wherein, if the conductive connection wire C1 and the routing segment 132 of the conductive routing wire 130 are located in the same metal layer, the routing segment 132 does not overlap or contact the conductive routing wire 130. On the contrary, if the conductive connection wire C1 and the routing segment 132 of the conductive routing wire 130 are located in different metal layers, the routing segment 132 of the conductive routing wire 130 may or may not overlap the conductive connection wire C1.

In some embodiments, in a layout of the input/output port circuit 100, the routing segment 132 of the conductive routing wire 130 may at least partially overlap the layout of the transistor 120.

In some embodiments, the routing segment 132 of the conductive routing wire 130 may at least partially overlap the layout of the first connection terminal 121 of the transistor 120. In some implementations, the routing segment 132 of the conductive routing wire 130 may be configured substantially corresponding to the layout range of the first connection terminal 121 of the transistor 120. Therefore, the routing segment 132 of the conductive routing wire 130 can substantially fall in the layout of the first connection terminal 121 of the transistor 120, as shown in FIG. 3 and FIG. 4, but the present application is not limited thereto. In other embodiments, the routing segment 132 of the conductive routing wire 130 may be configured corresponding to the layout range of the first connection terminal 121 of the transistor 120, and the routing segment 132 of the conductive routing wire 130 can exceed the layout of the first connection terminal 121 of the transistor 120 but not overlap the layout of the control terminal 123 of the transistor 120, as shown in FIG. 5.

Figure 6:
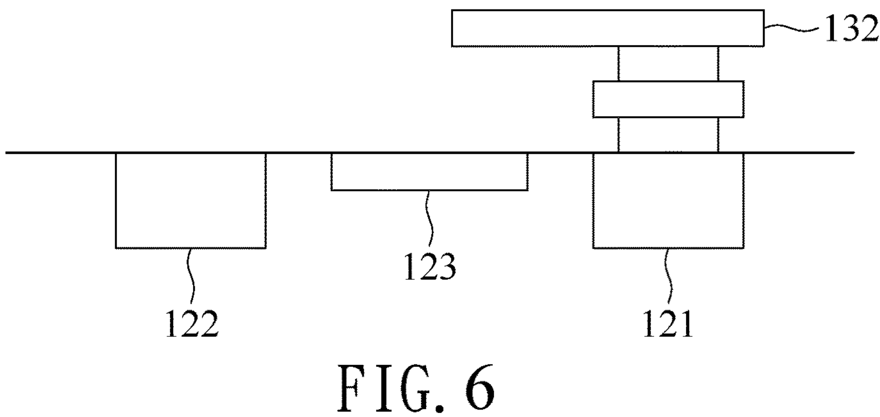
FIG. 6 illustrates a schematic cross-sectional view showing a relative relationship between a routing segment of a conductive routing wire and a layout of a transistor according to an embodiment of the present application.

In some embodiments, besides at least partially overlapping the layout of the first connection terminal 121 of the transistor 120, the routing segment 132 of the conductive routing wire 130 may further at least partially overlap the layout of the control terminal 123 of the transistor 120. In some implementations, the routing segment 132 of the conductive routing wire 130 may be configured substantially corresponding to the layout range of the first connection terminal 121 and the control terminal 123 of the transistor 120. Therefore, the routing segment 132 of the conductive routing wire 130 can substantially fall in the layout of the first connection terminal 121 and the control terminal 123 of the transistor 120, as shown in FIG. 3 and FIG. 4. Wherein, in one implementation, the routing segment 132 of the conductive routing wire 130 may only partially overlap the layout of the control terminal 123 of the transistor 120, as shown in FIG. 6. In another implementation, the routing segment 132 of the conductive routing wire 130 may completely cover the layout of the control terminal 123 of the transistor 120, as shown in FIG. 7, but the present application is not limited thereto.

Figure 5:
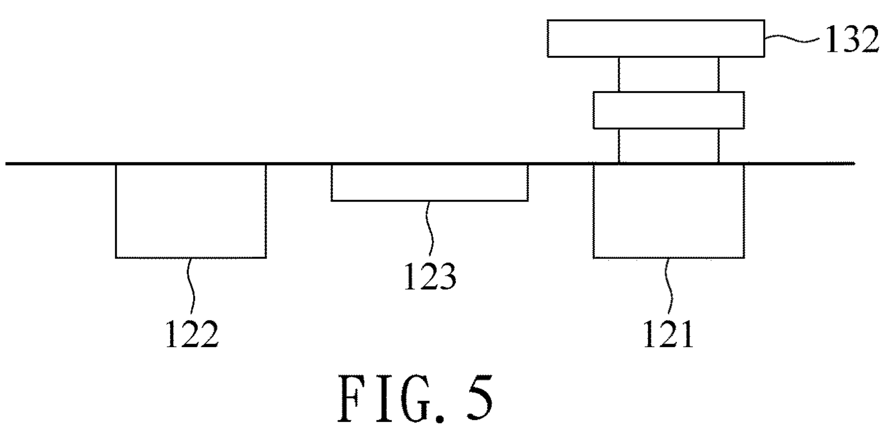
FIG. 5 illustrates a schematic cross-sectional view showing a relative relationship between a routing segment of a conductive routing wire and a layout of a transistor according to an embodiment of the present application.
Figure 7:
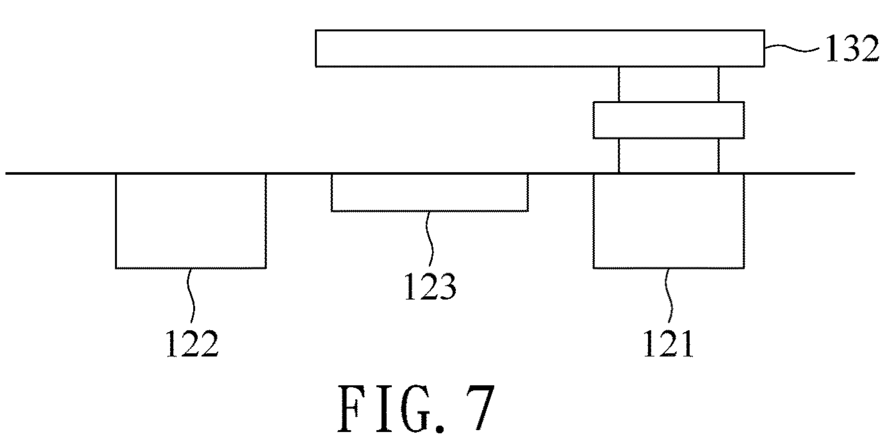
FIG. 7 illustrates a schematic cross-sectional view showing a relative relationship between a routing segment of a conductive routing wire and a layout of a transistor according to an embodiment of the present application.

In some embodiments, the routing segment 132 of the conductive routing wire 130 does not overlap the layout of the second connection terminal 122 of the transistor 120, as shown in FIG. 5 to FIG. 7.

Please refer to FIG. 3. In some embodiments, in a layout of the input/output port circuit 100, the first connection segment 131 of the conductive routing wire 130 may be opposite to the second connection segment 133. Furthermore, the routing segment 132 of the conductive routing wire 130 includes a first routing portion 1321, a second routing portion 1322, a third routing portion 1323, a fourth routing portion 1324, and a fifth routing portion 1325 sequentially connected to each other. The routing segment 132 of the conductive routing wire 130 is connected to the first connection segment 131 through the first routing portion 1321 and is connected to the second connection segment 133 through the fifth routing portion 1325. The second routing portion 1322 is opposite to the first connection segment 131. The fourth routing portion 1324 is opposite to the second connection segment 133. Moreover, the first routing portion 1321 and the fifth routing portion 1325 are respectively opposite to the third routing portion 1323. In this embodiment, the routing segment 132 of the conductive routing wire 130 may be substantially C-shaped. Furthermore, the conductive routing wire 130 may substantially fall in the layout of the first connection terminal 121 and the control terminal 123 of the transistor 120.

For example, it is assumed that the conductive routing wire 130 is located in a metal 2 layer and the conductive connection wire C1 is located in a metal 1 layer. In some implementations, as shown in FIG. 3, the conductive connection wire C1 may be configured corresponding to the center of the layout of the first connection terminal 121 of the transistor 120, and the conductive connection wire C1 may be provided with, for example, four contacts. Therefore, the conductive connection wire C1 can be electrically connected to the first connection terminal 121 of the transistor 120. Wherein, the extension direction of the conductive connection wire C1 is the Y axis of the layout substrate. The first connection segment 131 and the second connection segment 133 of the conductive routing wire 130 may be respectively configured substantially corresponding to the overlapping portion of the conductive connection wire C1 and the first connection terminal 121 of the transistor 120. Wherein, the extension direction of the first connection segment 131 and the second connection segment 133 of the conductive routing wire 130 is the Y axis of the layout substrate. The first connection segment 131 of the conductive routing wire 130 may be provided with, for example, four vias, and the conductive connection wire C1 may be provided with four contacts corresponding to the four vias. Therefore, the first connection segment 131 of the conductive routing wire 130 can be electrically connected to the first connection terminal 121 of the transistor 120. The second connection segment 133 of the conductive routing wire 130 may be provided with, for example, four vias. The routing segment 132 of the conductive routing wire 130 is configured substantially corresponding to the outmost periphery of the layout of the first connection terminal 121 of the transistor 120. Wherein, the extension direction of the second routing portion 1322 and the fourth routing portion 1324 of the routing segment 132 is the Y axis of the layout substrate, the extension direction of the first routing portion 1321, the third routing portion 1323, and the fifth routing portion 1325 is the X axis of the layout substrate, and the first routing portion 1321 and the fifth routing portion 1325 are located on the same extension line. Furthermore, the second routing portion 1322 and the fourth routing portion 1324 may partially overlap the layout of the control terminal 123 of the transistor 120, but the present application is not limited thereto. In other implementations, compared with the implementations described above, the routing segment 132 of the conductive routing wire 130 may be configured in a mirrored manner by using the extension line where the first routing portion 1321 and the fifth routing portion 1325 are located as a mirrored line. Moreover, the layout line of the conductive connection wire C1 and the first routing portion 1321, the second routing portion 1322, the third routing portion 1323, the fourth routing portion 1324, and the fifth routing portion 1325 of the conductive routing wire 130 may respectively be rectangular, S-shaped curved, or any irregular shape.

Please refer to FIG. 4. In some embodiments, in a layout of the input/output port circuit 100, the third routing portion 1323 may include a first sub-routing A1, a second sub-routing A2, a third sub-routing A3, a fourth sub-routing A4, and a fifth sub-routing A5 sequentially connected to each other. The third routing portion 1323 is connected to the second routing portion 1322 through the first sub-routing A1 and is connected to the fourth routing portion 1324 through the fifth sub-routing A5. The first sub-routing A1 is opposite to the first routing portion 1321. The fifth sub-routing A5 is opposite to the fifth routing portion 1325. The second sub-routing A2 is opposite to the second routing portion 1322. The fourth sub-routing A4 is opposite to the fourth routing portion 1324. In this embodiment, the third routing portion 1323 of the routing segment 132 may be substantially Ω-shaped. Furthermore, the conductive routing wire 130 may substantially fall in the layout of the first connection terminal 121 and the control terminal 123 of the transistor 120.

For instance, it is assumed that the conductive routing wire 130 is located in a metal 2 layer and the conductive connection wire C1 is located in a metal 1 layer. In some implementations, as shown in FIG. 4, the conductive connection wire C1 may be configured corresponding to the center of the layout of the first connection terminal 121 of the transistor 120, and the conductive connection wire C1 may be provided with, for example, four contacts. Therefore, the conductive connection wire C1 can be electrically connected to the first connection terminal 121 of the transistor 120. Wherein, the extension direction of the conductive connection wire C1 is the Y axis of the layout substrate. The first connection segment 131 and the second connection segment 133 of the conductive routing wire 130 may be respectively configured substantially corresponding to the overlapping portion of the conductive connection wire C1 and the first connection terminal 121 of the transistor 120. Wherein, the extension direction of the first connection segment 131 and the second connection segment 133 of the conductive routing wire 130 is the Y axis of the layout substrate. The first connection segment 131 of the conductive routing wire 130 may be provided with, for example, two vias, and the conductive connection wire C1 may be provided with two contacts corresponding to the two vias. Therefore, the first connection segment 131 of the conductive routing wire 130 can be electrically connected to the first connection terminal 121 of the transistor 120. The second connection segment 133 of the conductive routing wire 130 may be provided with, for example, two vias. In the routing segment 132 of the conductive routing wire 130, the Ω-shaped opening formed by the third routing portion 1323 may face upward, and the first routing portion 1321, the second routing portion 1322, the fourth routing portion 1324, and the fifth routing portion 1325 of the routing segment 132 are respectively configured corresponding to the outermost periphery of the layout of the first connection terminal 121 of the transistor 120. Wherein, the extension direction of the second routing portion 1322 and the fourth routing portion 1324 of the routing segment 132 and the second sub-routing A2 and the fourth sub-routing A4 of the third routing portion 1323 is the Y axis of the layout substrate. The extension direction of the first routing portion 1321, third routing portion 1323, and the fifth routing portion 1325 of the routing segment 132 and the first sub-routing A1, the third sub-routing A3, and the fifth sub-routing A5 of the third routing portion 1323 is the X axis of the layout substrate. The first routing portion 1321 and the fifth routing portion 1325 of the routing segment 132 are located on the same extension line, the first sub-routing A1 and the fifth sub-routing A5 of the third routing portion 1323 are located on the same extension line, and the third sub-routing A3, the first sub-routing A1, or the fifth sub-routing A5 of the third routing portion 1323 are not located on the same extension line. Furthermore, the second routing portion 1322 and the fourth routing portion 1324 of the routing segment 132 may partially overlap the layout of the control terminal 123 of the transistor 120, but the present application is not limited thereto. In other implementations, compared with the implementations described above, the third routing portion 1323 may be configured in a mirrored manner by using the extension line where the first sub-routing A1 and the fifth sub-routing A5 of the third routing portion 1323 are located as a mirrored line. In other words, in these implementations, the Ω-shaped opening formed by the third routing portion 1323 may face downward. In still other implementations, compared with the implementations described above, the routing segment 132 of the conductive routing wire 130 may further be configured in a mirrored manner by using the extension line where the first routing portion 1321 and the fifth routing portion 1325 are located as a mirrored line.

To sum up, according to one or some embodiment of the present application, the input/output port circuit and chip thereof provide additional serial resistance through an additional conductive routing wire which is electrically connected to the first connection terminal of the transistor, so that when a surge current is inputted in the input/output port circuit through the input/output pad, the temperature of the conductive routing wire rises and the resistance value of the provided serial resistance increases accordingly, thereby forcing the surge current to flow toword another transistor with relatively low resistance. In this case, the effect of current dispersion can be achieved, avoiding the single transistor from being damaged due to being punctured by the large current concentrating on the transistor.

Although the present application has been described in considerable detail with reference to certain preferred embodiments thereof, the disclosure is not for limiting the scope of the application. Persons having ordinary skill in the art may make various modifications and changes without departing from the scope and spirit of the present application. Therefore, the scope of the appended claims should not be limited to the description of the preferred embodiments described above.

What is claimed is:

1. An input/output port circuit, comprising:

an input/output pad;

a transistor, having a first connection terminal and a second connection terminal, wherein the first connection terminal is electrically connected to the input/output pad through a conductive connection wire, and the second connection terminal is electrically connected to another transistor; and a conductive routing wire, electrically connected to the first connection terminal of the transistor, wherein the conductive routing wire is configured to provide a serial resistance such that, when a surge current is inputted into the input/output port circuit through the input/output pad, a resistance value of the serial resistance increases with temperature, thereby forcing the surge current to be diverted toward the another transistor, wherein in a layout of the input/output port circuit, the conductive routing wire comprises a first connection segment, a routing segment, and a second connection segment sequentially connected to each other, and the routing segment is configured substantially corresponding to an outmost periphery of a layout of the first connection terminal of the transistor, wherein the routing segment comprises a first routing portion, a second routing portion, a third routing portion, a fourth routing portion, and a fifth routing portion sequentially connected to each other, an extension direction of the second routing portion and the fourth routing portion is a Y axis of a layout substrate, an extension direction of the first routing portion, the third routing portion, and the fifth routing portion is an X axis of the layout substrate, and the first routing portion and the fifth routing portion are located on the same extension line, and wherein the resistance value of the conductive routing wire is at least greater than several tens of ohms.

2. The input/output port circuit according to claim 1, wherein the first connection terminal of the transistor is only electrically connected to the input/output pad and the conductive routing wire.

3. The input/output port circuit according to claim 1, wherein in a layout of the input/output port circuit, the conductive connection wire and at least a portion of the conductive routing wire are located in different metal layers.

4. The input/output port circuit according to claim 1, wherein the first connection segment and the second connection segment are electrically connected to the first connection terminal of the transistor, respectively, and the first connection segment does not contact the second connection segment.

5. The input/output port circuit according to claim 4, wherein the conductive routing wire and the conductive connection wire are located in the same metal layer, and the routing segment of the conductive routing wire does not overlap the conductive connection wire.

6. The input/output port circuit according to claim 4, wherein the routing segment at least partially overlaps a layout of the transistor.

7. The input/output port circuit according to claim 6, wherein the routing segment at least partially overlaps a layout of a control terminal of the transistor.

8. The input/output port circuit according to claim 4, wherein the routing segment does not overlap a layout of the second connection terminal of the transistor.

9. The input/output port circuit according to claim 4, wherein the first connection segment is opposite and parallel to the second connection segment; the routing segment is connected to the first connection segment through the first routing portion and is connected to the second connection segment through the fifth routing portion; the second routing portion is opposite to the first connection segment, the fourth routing portion is opposite to the second connection segment, and the first routing portion and the fifth routing portion are respectively opposite to the third routing portion.

10. The input/output port circuit according to claim 9, wherein the third routing portion comprises a first sub-routing, a second sub-routing, a third sub-routing, a fourth sub-routing, and a fifth sub-routing sequentially connected to each other; the third routing portion is connected to the second routing portion through the first sub-routing and is connected to the fourth routing portion through the fifth sub-routing; the first sub-routing is opposite to the first routing portion, the fifth sub-routing is opposite to the fifth routing portion, and the second sub-routing is opposite to the fourth sub-routing.

11. A chip, comprising:

an input/output port circuit, comprising:

an input/output pad;

a transistor, having a first connection terminal and a second connection terminal, wherein the first connection terminal is electrically connected to the input/output pad through a conductive connection wire, and the second connection terminal is electrically connected to another transistor; and a conductive routing wire, electrically connected to the first connection terminal of the transistor, wherein the conductive routing wire is configured to provide a serial resistance such that, when a surge current is inputted into the input/output port circuit through the input/output pad, a resistance value of the serial resistance increases with temperature, thereby forcing the surge current to be diverted toward the another transistor, wherein in a layout of the input/output port circuit, the conductive routing wire comprises a first connection segment, a routing segment, and a second connection segment sequentially connected to each other, and the routing segment is configured substantially corresponding to an outmost periphery of a layout of the first connection terminal of the transistor, wherein the routing segment comprises a first routing portion, a second routing portion, a third routing portion, a fourth routing portion, and a fifth routing portion sequentially connected to each other, an extension direction of the second routing portion and the fourth routing portion is a Y axis of a layout substrate, an extension direction of the first routing portion, the third routing portion, and the fifth routing portion is an X axis of the layout substrate, and the first routing portion and the fifth routing portion are located on the same extension line, and wherein the resistance value of the conductive routing wire is at least greater than several tens of ohms.

12. The chip according to claim 11, wherein the first connection terminal of the transistor is only electrically connected to the input/output pad and the conductive routing wire.

13. The chip according to claim 11, wherein in a layout of the input/output circuit, the conductive connection wire and at least portion of the conductive routing wire are located in different metal layers.

14. The chip according to claim 11, wherein the first connection segment and the second connection segment are electrically connected to the first connection terminal of the transistor, respectively, and the first connection segment does not contact the second connection segment.

15. The chip according to claim 14, wherein the conductive routing wire and the conductive connection wire are located in the same metal layer, and the routing segment of the conductive routing wire does not overlap the conductive connection wire.

16. The chip according to claim 14, wherein the routing segment at least partially overlaps a layout of the transistor.

17. The chip according to claim 16, wherein the routing segment at least partially overlaps a layout of a control terminal of the transistor.

18. The chip according to claim 14, wherein the routing segment does not overlap a layout of the second connection terminal of the transistor.

19. The chip according to claim 14, wherein the first connection segment is opposite and parallel to the second connection segment; the routing segment is connected to the first connection segment through the first routing portion and is connected to the second connection segment through the fifth routing portion; the second routing portion is opposite to the first connection segment, the fourth routing portion is opposite to the second connection segment, and the first routing portion and the fifth routing portion are respectively opposite to the third routing portion.

20. The chip according to claim 19, wherein the third routing portion comprises a first sub-routing, a second sub-routing, a third sub-routing, a fourth sub-routing, and a fifth sub-routing sequentially connected to each other; the third routing portion is connected to the second routing portion through the first sub-routing and is connected to the fourth routing portion through the fifth sub-routing; the first sub-routing is opposite to the first routing portion, the fifth sub-routing is opposite to the fifth routing portion, and the second sub-routing is opposite to the fourth sub-routing.

* * * * *